United States Patent [19]
Wandt et al.

[11] Patent Number: 5,251,104
[45] Date of Patent: Oct. 5, 1993

[54] ENCLOSURE LATCH SYSTEM INCLUDING A BEARING SURFACE TAPERING FROM FLAT TO CYLINDRICAL

[75] Inventors: Henry Wandt, Boca Raton; Dwight D. Brooks, Boynton Beach, both of Fla.

[73] Assignee: Motorola, Inc., Schaumburg, Ill.

[21] Appl. No.: 904,113

[22] Filed: Jun. 25, 1992

[51] Int. Cl.$^5$ .................. H05K 5/02; E05C 19/06
[52] U.S. Cl. .................. 361/736; 361/390; 361/740; 361/724; 292/17; 292/DIG. 38; 403/254
[58] Field of Search .............. 292/17, 76, 87, 303, 292/DIG. 38; 40/661; 455/347, 348, 349; 312/208.3, 223.2, 293.3; 220/4.02, 306; 403/70, 71, 254, 381; 361/380, 392, 395, 399, 422; 174/50, 52.1

[56] References Cited
U.S. PATENT DOCUMENTS

| | | | |
|---|---|---|---|
| 4,616,764 | 10/1986 | Utoh et al. | 220/306 |
| 4,964,661 | 10/1990 | Cadwell et al. | 292/87 |
| 4,974,740 | 12/1990 | Niles et al. | 292/DIG. 38 X |
| 5,060,990 | 10/1991 | Smith et al. | 292/DIG. 38 X |

OTHER PUBLICATIONS

Instruction Manual 68P81008B15-0, entitled "Key-Note" Series Decimal Digital Radio Pagers Tone and Voice, Motorola, Inc. of Schaumburg, Ill., p. 10 (Disassembly) p. 26 (Exploded View Diagram & Parts List), 1989.
Service Manual 6881011B55, entitled "Advisor" Message Receivers, Motorola, Inc. of Schaumburg, Ill., p. 2 (Removing the back cover) p. 12 (Exploded View Diagram and Parts List), 1990.

Primary Examiner—Leo P. Picard
Assistant Examiner—Michael W. Phillips
Attorney, Agent, or Firm—R. Louis Breeden; Philip P. Macnak; Thomas G. Berry

[57] ABSTRACT

An enclosure latch system includes an insertable member (106) connected to a first enclosure section (102), and a mating recess (108) within a second enclosure section (104) for engaging with the insertable member (106), thereby latching the first and second enclosure sections (102, 104) together. The insertable member (106) includes an extender member (202) connected at an attachment end to the first enclosure section (102) for extending the insertable member (106) into the second enclosure section (104), and a latch tooth (204) protruding from the extender member (202) near a free end. The latch tooth (204) has a mating surface (206, 208) that tapers from flat on a first side to cylindrical on a second side opposite the first side for latching the first and second enclosure sections (102, 104) when the latch tooth (204) is in the mating recess (108). The mating surface (206, 208) functions further for unlatching the first and second enclosure sections (102, 104) by forcibly removing the latch tooth (204) from the mating recess (108) in response to a directional torque (210).

15 Claims, 1 Drawing Sheet 5,251,104

ENCLOSURE LATCH SYSTEM INCLUDING A BEARING SURFACE TAPERING FROM FLAT TO CYLINDRICAL

FIELD OF THE INVENTION

This invention relates in general to enclosure latch systems for devices, and more specifically to latch systems using cantilevered snaps and mating recesses.

BACKGROUND OF THE INVENTION

There are many types of latch systems for enclosures of devices, such as electronic devices. One well-known type of latch system is based upon an arrangement of cantilevered snaps and mating recesses. Such latch systems are advantageous in that they eliminate screws and screw bosses, thereby reducing assembly labor and increasing circuit board area usable for the electronic device. A further advantage is that such latch systems discourage unauthorized tampering with the electronic device by users who cannot readily discern a method of opening the enclosure.

A disadvantage of conventional latch systems using cantilevered snaps and mating recesses is that once such systems are latched together, they cannot be unlatched easily when required, e.g., for service. Simply applying force against such a conventional latch system in an attempt to unlatch it can damage or destroy the latch system. The correct—but tedious—way to unlatch such conventional systems is by prying each snap out of its mating recess using a screwdriver blade or in some cases a special enclosure disassembly tool. Still, service personnel and equipment users can and do sometimes attempt to open conventional latch systems using improper procedures resulting in damage to the latch system.

Thus, what is needed is a latch system that provides all the advantages offered by conventional latch systems using cantilevered snaps and mating recesses but that eliminates the aforementioned disadvantage. That is to say, a latch system using cantilevered snaps and mating recesses that can be both latched and unlatched without requiring the use of a tool is needed.

One aspect of the present invention is a latch member for use in a latch system of an enclosure, the latch member comprising first and second structures comprising a flexible extension member having an attachment end and a free end, the attachment end connected to the first structure in a manner that extends the free end towards the second structure. The latch member further comprises a latch tooth contiguous with the free end of the flexible extension member and having a bearing surface for engaging with a mating recess formed in the second structure. The bearing surface tapers from a substantially flat surface at a first side of the latch tooth to a substantially cylindrical surface at a second side of the latch tooth opposite the first side. When the latch tooth is inside the mating recess, the substantially flat surface engages with the mating recess, thereby latching the first and second structures together. In response to a directional unlatching force of sufficient magnitude to flex the flexible member, the substantially cylindrical surface makes contact with the mating recess in a manner that forces the latch tooth from the mating recess, thereby unlatching the first and second structures.

Another aspect of the present invention is an enclosure latch system for latching and unlatching first and second enclosure sections. The enclosure latch system comprises at least one insertable member connected to the first enclosure section, and at least one mating recess formed within the second enclosure section for engaging with the at least one insertable member, thereby latching the first and second enclosure sections together. The at least one insertable member comprises an extender member connected at an attachment end to the first enclosure section for extending the insertable member into the second enclosure section, and a latch tooth protruding from the extender member near a free end opposite the attachment end of the extender member for latching and unlatching the first and second enclosure sections. The latch tooth comprises a mating surface that tapers from substantially flat on a first side of the latch tooth to substantially cylindrical on a second side of the latch tooth opposite the first side for latching the first and second enclosure sections when the latch tooth is in the mating recess. The mating surface functions further for unlatching the first and second enclosure sections by forcibly removing the latch tooth from the mating recess in response to a directional torque resulting from a separating force applied at a first end of the first and second enclosure sections closer to the second side of the latch tooth than to the first side of the latch tooth. The enclosure latch system further comprises hinge means for rotatably engaging the first and second enclosure sections to one another at a second end opposite the first end for facilitating latching of the enclosure latch system and for preventing the application of a torque having a direction which could damage the enclosure latch system.

Another aspect of the present invention is a selective call receiver comprising a printed circuit board including selective call receiver circuits for receiving selective call messages and presenting the selective call messages to a user, and an enclosure surrounding and protecting the printed circuit board. The enclosure comprises first and second enclosure sections, and an enclosure latch system for latching and unlatching the first and second enclosure sections. The enclosure latch system comprises at least one insertable member coupled to the first enclosure section, and at least one portion of the second enclosure section forming a mating recess therein for engaging with the at least one insertable member to latch the first and second enclosure sections together. The at least one insertable member comprises a cantilever having a first end connected to the first enclosure section, and having a second end, for extending the insertable member into the second enclosure section, and a boss contiguous with the second end of the cantilever for latching and unlatching the first and second enclosure sections. The boss comprises a substantially flat surface at a first side of the boss, the flat surface tapering substantially to a point at a second side of the boss opposite the first side, for engaging with the mating recess, thereby latching the first and second enclosure sections together. The boss further comprises a substantially cylindrical surface, contiguous with and alongside the flat surface and tapering from subtending an arc of substantially 90 degrees at the second side of the boss to substantially 0 degrees at the first side. The substantially cylindrical surface is for forcibly removing the boss from the mating recess to unlatch the first and second enclosure sections in response to a directional torque resulting from a separating force applied at a first end of the first and second enclosure sections closer to the second side of the boss than to the first side. The enclosure latch system further comprises hinge means for rotatably engaging the first and second enclosure sections with one another at a second end opposite the first end for facilitating latching of the latch system and for preventing the application of a torque having a direction that could damage the enclosure latch system.

DESCRIPTION OF A PREFERRED EMBODIMENT

Figure 1:
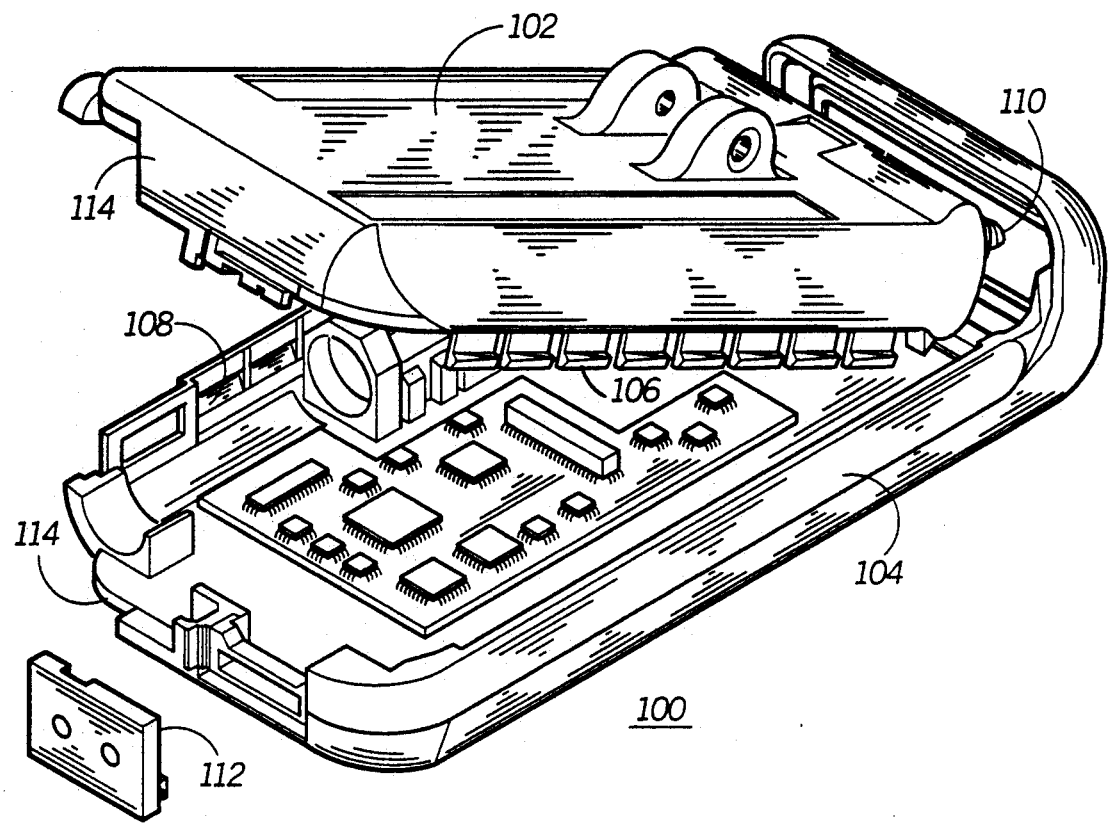
FIG. 1 is an isometric projection of a selective call receiver having a latch system in accordance with a preferred embodiment of the present invention.

With reference to FIG. 1, an isometric projection of a selective call receiver 100 having a latch system in accordance with a preferred embodiment of the present invention is shown. The selective call receiver comprises a first enclosure section 102 comprising a plurality of cantilevered snaps 106 for insertion into a plurality of mating recesses 108 in a second enclosure section 104. Preferably, the first and second enclosures 102, 104 are constructed from an injection molded plastic material. The first and second enclosure sections 102, 104 surround and protect a printed circuit board 116 comprising well-known electronic circuits of the selective call receiver 100. For ease of assembly as well as for preventing an incorrect direction of disassembly, there is a lap joint 110 at one end of the first and second enclosure sections 102, 104.

To assemble the first and second enclosures 102, 104 the lap joint 110 is engaged. The first enclosure section 102 is then rotated toward the second enclosure section 104 until each of the plurality of cantilevered snaps is fully engaged with a corresponding one of the plurality of mating recesses 108.

Unlike with conventional snap-fit latch systems, to disassemble the first and second enclosure sections 102, 104 the first enclosure section 102 is rotated away from the second enclosure section 104 by applying a moderate separating force to the first and second enclosure sections, starting at the end 114. Because of the direction of the force applied and the special shape of the cantilevered snaps 106 in accordance with the present invention as discussed herein below, the cantilevered snaps will unlatch without damage and without the need for any disassembly tools.

For additional security, a secondary means of preventing unlatching, e.g., when the selective call receiver is accidentally dropped, is provided by a second latch mechanism 112 at the end 114. When the second latch mechanism 112 is engaged, it prevents any torque on the cantilevered snaps 106 in a direction that would cause them to unlatch accidentally.

With reference to FIGS. 2, 3, 4, and 5, the cantilevered snap 106 of the latch system in accordance with the preferred embodiment of the present invention comprises a cantilever 202 coupled to the first enclosure section 102 (FIG. 1). The cantilever 202 is coupled to a boss 204 for mating with one of the plurality of mating recesses 108 in the second enclosure section 104 (FIG. 1). The boss 204 comprises two bearing surfaces, a flat bearing surface 206 and a cylindrical bearing surface 208. The boss is formed and positioned such that at a first end closer to the lap joint 110 (FIG. 1) the flat bearing surface 206 occupies the full extent of the boss 204 in a direction away from the cantilever 202. At a second end opposite the first end and farther from the lap joint 110 the cylindrical surface occupies the full extent of the boss in a direction away from the cantilever 202.

Between the first end and the second end the flat bearing surface 206 gradually changes into the cylindrical bearing surface 208 along a diagonal line extending from a point on the two bearing surfaces 206, 208 farthest from the cantilever 202 at the first end to a point on the two bearing surfaces 206, 208 closest to the cantilever 202. Normally while the latch system is latched, the flat bearing surface 206 is engaged with a portion of a flat surface of one of the plurality of mating recesses 108. Under this condition the flat bearing surface 206 bears the force necessary for latching the first and second enclosure sections 102, 104 together.

Figure 2:
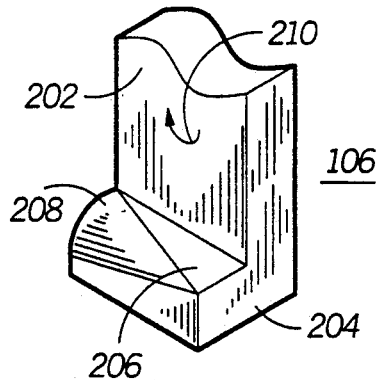
FIG. 2 is an isometric projection of a cantilevered snap of the latch system in accordance with the preferred embodiment of the present invention.
Figure 3:
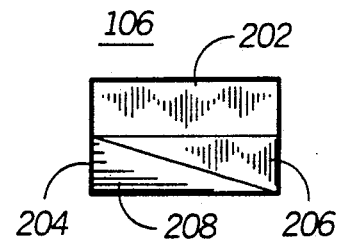
FIG. 3 is an orthographic top view of the cantilevered snap of the latch system in accordance with the preferred embodiment of the present invention.
Figure 4:
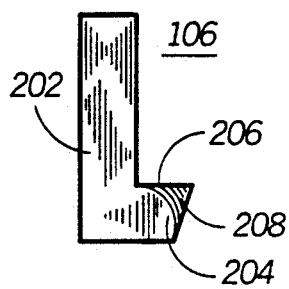
FIG. 4 is an orthographic side view of the cantilevered snap of the latch system in accordance with the preferred embodiment of the present invention.
Figure 5:
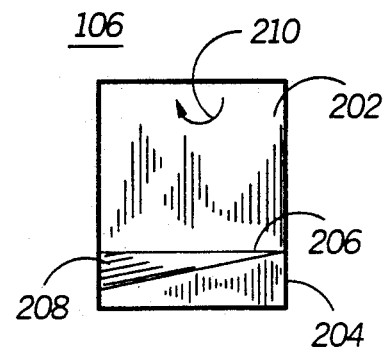
FIG. 5 is an orthographic front view of the cantilevered snap of the latch system in accordance with the preferred embodiment of the present invention.

When a torque 210 is applied to the top of the cantilevered snap 106 in a clockwise direction in the views of FIG. 2 and FIG. 5, the cantilevered snap 106 flexes sufficiently to bring the cylindrical bearing surface 208 into contact with a portion of the flat surface of the mating recess 108. Under this condition the cylindrical bearing surface 208 bears a portion of the force resulting from the torque 210. Because of its shape the cylindrical bearing surface 208 develops a force component that tends to push the boss 204 away from the mating recess 108. In response to a sufficient clockwise torque 210 the cylindrical bearing surface 208 will push the boss 204 completely out of the mating recess 108, thereby unlatching the cantilevered snap 106 without requiring the use of a tool.

Thus the present invention comprises a latch system that provides all the advantages provided by conventional latch systems using cantilevered snaps and mating recesses but that eliminates the aforementioned disadvantage. The present invention comprises a latch system using cantilevered snaps 106 and mating recesses 108 that can be both latched and unlatched without requiring the use of a tool. Because the shape of the bearing surfaces 206, 208 of the cantilevered snaps 106 changes gradually from flat to cylindrical, the latch system according to the present invention can be unlatched without damage by applying a moderate separating force to the two enclosure sections 102, 104 at an end opposite the lap joint 110. The present invention is particularly well suited as a latch system for enclosures of electronic devices in which there is no need for user access but there may be an occasional need for access by authorized personnel for service or adjustment.

What is claimed is:

1. An enclosure latch system for latching and unlatching first and second enclosure sections, the enclosure latch system comprising:
   at least one insertable member connected to the first enclosure section;
   at least one mating recess formed within the second enclosure section for engaging with the at least one insertable member, thereby latching the first and second enclosure sections together, wherein the at least one insertable member comprises:

an extender member connected at an attachment end to the first enclosure section for extending the insertable member into the second enclosure section; and a latch tooth protruding from the extender member near a free end opposite the attachment end of the extender ember for latching and unlatching the first and second enclosure section, the latch tooth comprising:

a mating surface that tapers from substantially flat on a first side of the latch tooth to substantially cylindrical on a second side of the latch tooth opposite the first side for latching the first and second enclosure sections when the latch tooth is in the mating recess, and further for unlatching the first and second enclosure sections by forcibly removing the latch tooth from the mating recess in response to a directional torque resulting from a separating force applied at a first end of the first and second enclosure sections closer to the second side of the latch tooth than to the first side of the latch tooth; and hinge means for rotatably engaging the first and second enclosure sections to one another at a second end opposite the first end for facilitating latching of the enclosure latch system and for preventing the application of a torque having a direction which could damage the enclosure latch system.

2. A latch system for latching and unlatching first and second structures, the latch system comprising:

an insertable member connected to the first structure;

a portion of the second structure forming a mating recess for engaging with the insertable member, wherein the insertable member comprises:

a cantilever having a first end connected to the first structure, and having a second end, for extending the insertable member into the second structure; and a boss contiguous with the second end of the cantilever for latching and unlatching the first and second structures, the boss comprising:

a substantially flat surface at a first side of the boss, tapering substantially to a point at a second side of the boss opposite the first side, for engaging with the mating recess, thereby latching the first and second structures together; and a substantially cylindrical surface, contiguous with and alongside the first surface and tapering from subtending an arc of substantially 90 degrees at the second side of the boss to substantially 0 degrees at the first side, for forcibly removing the boss from the mating recess to unlatch the first and second structures in response to a directional torque resulting from a separating force applied at a first end of the first and second structures closer to the second side of the boss than to the first side; and hinge means for rotatably engaging the first and second structures with one another at a second end opposite the first end for facilitating latching of the latch system and for preventing the application of a torque having a direction that could damage the latch system.

3. The latch system according to claim 2, wherein the latch system is constructed of an injection molded plastic material.

4. The latch system according to claim 2, wherein the hinge means comprises a lap joint at the second end of the first and second structures for preventing the first and second structures from being separated at the second end until after the latch system has been unlatched by forcibly separating the first and second structures at the first end.

5. A selective call receiver comprising:

a printed circuit board comprising selective call receiver circuits for receiving selective call messages and presenting the selective call messages to a user;

an enclosure surrounding and protecting the printed circuit board, the enclosure comprising first and second enclosure sections; and an enclosure latch system for latching and unlatching the first and second enclosure sections, the enclosure latch system comprising:

at least one insertable member coupled to the first enclosure section;

at least one portion of the second enclosure section forming a mating recess therein for engaging with the at least one insertable member to latch the first and second enclosure sections together, wherein the at least one insertable member comprises:

a cantilever having a first end connected to the first enclosure section, and having a second end, for extending the insertable member into the second enclosure section; and boss contiguous with the second end of the cantilever for latching and unlatching the first and second enclosure sections, the boss comprising:

a substantially flat surface at a first side of the boss, the flat surface tapering substantially to a point at a second side of the boss opposite the first side, for engaging with the mating recess, thereby latching the first and second enclosure sections together; and a substantially cylindrical surface, contiguous with and alongside the flat surface and tapering from subtending an arc of substantially 90 degrees at the second side of the boss to substantially 0 degrees at the first side, for forcibly removing the boss from the mating recess to unlatch the first and second enclosure sections in response to a directional torque resulting from a separating force applied at a first end of the first and second enclosure sections closer to the second side of the boss than to the first side; and hinge means for rotatably engaging the first and second enclosure sections with one another at a second end opposite the first end for facilitating latching of the latch system and for preventing the application of a torque having a direction that could damage the enclosure latch system.

6. The selective call receiver according to claim 5 wherein the enclosure latch system is constructed of an injection molded plastic material.

7. The selective call receiver according to claim 5, wherein the hinge means comprises a lap joint at the second end of the first and second enclosure sections for preventing the first and second enclosure sections from being separated at the second end until after the enclosure latch system has been unlatched by forcibly separating the first and second enclosure sections at the first end.

8. A latch member for use in a latch system of an enclosure comprising first and second structures, the latch member comprising:
- a flexible extension member having an attachment end and a free end, the attachment end connected to the first structure in a manner that extends the free end towards the second structure; and
- a latch tooth contiguous with the free end of the flexible extension member and having a bearing surface for engaging with a mating recess formed in the second structure,
- wherein the bearing surface tapers from a substantially flat surface at a first side of the latch tooth to a substantially cylindrical surface at a second side of the latch tooth opposite the first side, and
- wherein, when the latch tooth is inside the mating recess, the substantially flat surface engages with the mating recess, thereby latching the first and second structures together, and
- wherein, in response to a directional unlatching force of sufficient magnitude to flex the flexible member, the substantially cylindrical surface makes contact with the mating recess in a manner that forces the latch tooth from the mating recess, thereby unlatching the first and second structures.

9. The latch member according to claim 8, wherein the latch member is constructed of an injection molded plastic material.

10. The latch member of claim 8, wherein the flexible extension member and the latch tooth are formed as contiguous elements of the first structure.

11. A latch system for latching and unlatching first and second structures, the latch system comprising:
- a flexible extension member having an attachment end and a free end, the attachment end connected to the first structure in a manner that extends the free end towards the second structure;
- a latch tooth contiguous with the free end of the flexible extension member and having a bearing surface for engaging with a mating recess formed in the second structure,
- wherein the bearing surface tapers from a substantially flat surface at a first side of the latch tooth to a substantially cylindrical surface at a second side of the latch tooth opposite the first side, and
- wherein, when the latch tooth is inside the mating recess, the substantially flat surface engages with the mating recess, thereby latching the first and second structures together, and
- wherein, in response to application at a first end of the first and second structures of a directional unlatching force of sufficient magnitude to flex the flexible extension member, the substantially cylindrical surface makes contact with the mating recess in a manner that forces the latch tooth from the mating recess, thereby unlatching the first and second structures; and
- hinge means for rotatably engaging the first and second structures with one another at a second end opposite the first end for facilitating latching of the latch system and for preventing application of the directional unlatching force in a direction that could damage the latch system.

12. The latch system of claim 11, wherein the flexible extension member and the latch tooth are formed as contiguous elements of the first structure.

13. The latch system of claim 11, wherein the hinge means is formed contiguous with the first and second structures.

14. The latch system according to claim 11, wherein the latch system is constructed of an injection molded plastic material.

15. The latch system according to claim 11, wherein the hinge means comprises a lap joint at the second end of the first and second structures for preventing the first and second structures from being separated at the second end until after the latch system has been unlatched by forcibly separating the first and second structures at the first end.

* * * * *